United States Patent [19]

Thaik

[11] Patent Number: 5,285,116
[45] Date of Patent: Feb. 8, 1994

[54] LOW-NOISE HIGH-SPEED OUTPUT BUFFER AND METHOD FOR CONTROLLING SAME

[75] Inventor: Albert Thaik, Cupertino, Calif.

[73] Assignee: MIPS Computer Systems, Inc., Sunnyvale, Calif.

[21] Appl. No.: 573,926

[22] Filed: Aug. 28, 1990

[51] Int. Cl.$^5$ ......................................... H03K 19/017
[52] U.S. Cl. ................................... 307/443; 307/263; 307/475; 307/481
[58] Field of Search ............... 307/443, 451, 475, 481, 307/263; 377/45

[56] References Cited

U.S. PATENT DOCUMENTS

| | | | |
|---|---|---|---|
| 4,972,101 | 11/1990 | Partovi et al. | 307/263 X |
| 5,010,256 | 4/1991 | Dicke | 307/443 X |
| 5,013,940 | 5/1991 | Ansel | 307/443 X |
| 5,017,807 | 5/1991 | Kriz et al. | 307/451 X |
| 5,057,711 | 10/1991 | Lee et al. | 307/443 |
| 5,118,971 | 6/1992 | Schenck | 307/263 X |

OTHER PUBLICATIONS

Weste, et al. "Input-Output (I/O) Structures", *Principles of CMOS VLSI Design-A Systems Perspective* (1985) pp. 224-230.
Mead, et al. "Communication with the Outside World", *Introduction to VLSI Systems* (1986) pp. 164-166.
Annaratone "Output Buffer", *Digital CMOS Circuit Design* (1986) pp. 260-274.
Shoji "Input/Output Buffers", *CMOS Digital Circuit Technology* (1988) pp. 79-83.
Shoji "Output Drivers", *CMOS Digital Circuit Technology* (1988) pp. 307-313.
"CMOS Output for Megabit DRAM's", *IEEE Journal of Solid-State Circuits*, vol. 23, No. 3, Jun. 1988.
*IEEE Journal of Solid-State Circuits*, vol. SC-20, No. 6, Dec. 1985 (Patent Abstracts-4,508,981, 4,634,902).
"A Low Noise Data-Out Buffer in CMOS SRAM", Mitsubishi Electric Corporation, LSI R & D Lab.
"Ground Bounce Control in CMOS Integrated Circuit", *IEEE International Solid-State Circuits Conference* Feb. 17, 1988.
"Short-Circuit Dissipation of Static CMOS Circuitry and its Impact on the Design of Buffer Circuits" *IEEE Journal of Solid-State Circuits*, vol. SC-19, No. 4, Aug., 1984.
Katopis "Delta-I Noise Specification for a High-Performance Computing Machine", *Proceedings of the IEEE* vol. 73, No. 9 Sep. 1985.

*Primary Examiner*—David R. Hudspeth
*Attorney, Agent, or Firm*—Townsend and Townsend Khourie and Crew

[57] ABSTRACT

A low-noise high-speed output buffer receives digital control signals for varying the switching delay and di/dt of the buffer. For a plurality of output buffers, one buffer is used to determine the digital control signal values for the rest. The switching delay is controlled by referencing the one output buffer's delay to a clock cycle (e.g., 0.75 T or T, where T equals the clock cycle period). The digital control signal values which define the delay with reference to the clock cycle also determine the di/dt for the output buffers. As process or operating conditions vary, the control signal values change to maintain the delay in the prescribed relation to the clock cycle. Accordingly, the absolute di/dt values change. Thus, the output signal is available by the time needed (e.g., 0.75 T), while the di/dt is varied to an optimum setting based on the absolute delay time. As a result, the variation in di/dt from fastest conditions to slowest conditions is smaller enabling an increased ability to conform to noise margin requirements for increasingly faster systems. Accordingly, a low-noise high-speed output buffer and method of controlling the same is provided.

19 Claims, 9 Drawing Sheets

LOW-NOISE HIGH-SPEED OUTPUT BUFFER AND METHOD FOR CONTROLLING SAME

BACKGROUND OF THE INVENTION

This invention relates to a high-speed low-noise output buffer, and more particularly, to an output buffer apparatus and method for controlling switching delay of the output buffer and change in current with respect to time during a switching operation so as to control the switching speed with maximum efficiency across process, temperature and supply voltage variations.

The most significant requirement of an output buffer is to drive the output voltage to the specified logic threshold by the time the voltage is needed and to maintain that level with adequate noise margins as long as required. As the noise generated during switching of an output buffer may vary according to process speed, temperature and supply voltage, a way of controlling the switching noise substantially independent of such variations is needed.

Conventional output buffers do not control the switching noise so as to be independent of variations in process or operating conditions. Typically, a switching speed is adopted at which the noise margins are maintained even if process or operating conditions vary. Generally, as system speeds increase, the operating speeds of the components also must increase. As a result, the switching time requirement shortens making it more difficult to maintain the noise margins under varying process and operating conditions. For example, process conditions vary from device to device, even though such devices may be rated the same (i.e., a processor rated for 30 MHz may run at 34.5 MHz for a fast chip and 30.0 MHz for a slow chip, while still satisfying 30 MHz rating within acceptable tolerances). A buffer designed to have adequate switching speed within noise margins for a fast case, may have an inadequate switching speed for a slow case.

One source of noise is the current spike caused by the charging or discharging of a load capacitor at the output line of the output buffer during switching. Such load capacitor sinks or sources current when charging or discharging, respectively, resulting in the current spike. Associated with the current spike is a change in current with respect to a change in time (di/dt) which causes a bounce in the power or ground voltage which is equal to L di/dt, where L is the effective inductance of the bond wires and the power or ground pins. This inductive noise lowers the noise margins for the system and is detrimental to the overall system noise immunity. For example, in a package of output buffers which share common power or ground pins, the switching of one or more of the buffers may create a spike at the ground pin which causes another non-switching driver to appear switched during the spike. Thus, the di/dt value needs to be limited to an acceptable level.

Limiting the di/dt of an output buffer, however, also limits the speed at which the output can switch. With an ideal di/dt waveform, as shown at curve A in FIG. 1 (i.e., a square wave), the fastest switching time possible for changing the voltage on the load capacitor, $C_L$, by a voltage differential dV at a given di/dt is:

$$t = [(4C_L \, dV)/(di/dt)]^{\frac{1}{2}}$$

where t = delay time to charge or discharge $C_L$
$C_L$ = load capacitance
dV = change in voltage at output Accordingly, there is a trade-off between speed and di/dt. As described above, the conventional approach for designing output buffers is to design for a particular delay and di/dt at which speed and noise margin requirements both are met. For example, a conventional approach is to attempt to hold the switching delay and di/dt values constant for variations in process or operating conditions. As speed requirements increase and it becomes tougher to meet the noise margin requirements for varying process and operating conditions, designers have looked to the relation between t and di/dt to find alternative approaches for increasing speed while meeting noise margin requirements.

As can be seen from the formula above, approaches for decreasing switching delay time, t, include (1) reducing the load capacitance, $C_L$, (2) reducing the change in voltage, dV and (3) increasing the di/dt.

With regard to decreasing the load capacitance, the ability to decrease such capacitance is limited by the capacitance of the board signal paths combined with the input capacitance of load devices receiving the output signal from the output buffer.

With regard to decreasing the change in voltage dV, the CMOS rail-to-rail voltage swing may be reduced to the TTL voltage level swing. Such decreasing is accomplished by reducing the voltage swing between the logic "0" state and the logic "1" state to the output, or by precharging the output to an intermediate level, then charging the output to the desired level.

The remaining approach for improving the delay, t, is by increasing the di/dt value. Increasing the di/dt increases speed (decreases delay), but also increases the noise. Accordingly, there is a need for increasing di/dt while assuring that noise margin requirements are met for both fast and slow cases as defined by varying process and operating conditions.

One approach which enables an increased di/dt without significantly increasing the noise is to use a better package in which the inductances of the bond wires and power and ground pins are reduced. Thus, an increase in di/dt can be offset to a certain extent by a decrease in inductance, L, for the noise equation, (noise=L di/dt).

As the output buffers come in packages and the switching of outputs simultaneously causes the resulting noise spike to increase by superposition, the di/dt also can be increased by reducing the number of outputs which switch simultaneously. For example, if ten buffers each having a di/dt of 30 mA/ns normally are switched simultaneously resulting in a di/dt of 300 mA/ns (i.e., 10×30 mA/ns), decreasing the number of buffers which switch simultaneously to five allows the di/dt of each buffer to be increased to up to 60 mA/ns to generate the same 300 mA/ns.

As the di/dt waveforms in practice do not achieve the ideal square wave shape, but more closely resemble the sine wave as shown at curve B of FIG. 1, another approach is to improve the di/dt curve so as to more closely resemble the ideal curve. Referring to the di/dt curve B of FIG. 1, which shows the curve as actually achieved, the first half of the sine wave is the lead portion and the last half of the sine wave is the lag portion. Known approaches addressing the di/dt curve shape have improved the shape of the lead portion only, and ignored the shape of the lag portion.

The control over the lead portion of the di/dt curve for an output buffer 10 traditionally has been implemented by limiting the slew rate on the gate input of the output drive transistor 11 using a predriver circuit 13 as shown in FIG. 2. The switching delay versus di/dt trade-off is complicated, however, in that delay variations occur of up to three or four to one for MOS transistors as a result of process, temperature, and power supply variations. For example, process and operating system variations may result in fastest case components having actual speeds of 45 MHz and slowest case speeds of 15 MHz for a specified 25 MHz processor. An output buffer which generates an acceptable amount of L di/dt noise and switches with a reasonable speed in the fastest case may be unacceptably slow in the slowest case.

One approach for adjusting the slew rate under various conditions is to transform the predriver of FIG. 2 from a simple inverter 13 to a current limited pull-up device by inserting an additional transistor controlled by an analog voltage. Referring to FIG. 3, a portion of such an output buffer 10' is shown. The signal to be output is fed into a predriver including NMOS and PMOS transistors 12, 14. The output signal then is pulled up by a PMOS transistor 16 under the control of an analog voltage to limit the slew on the gate input of the drive transistor 18. Accordingly, the di/dt is controlled. However, it is only the lead portion of the di/dt curve which is controlled. The lag portion is dependent on the width of the output transistor, which is held constant according to this approach. Thus, the lag portion is not controlled. Furthermore, such an approach is undesirable because of the need to distribute a sensitive analog voltage in the I/O frame—precisely the location where the maximum amount of noise is being generated.

Accordingly an output buffer in which the di/dt value is controlled over the lead and lag portions of the switching curve is not known. Further an output buffer in which the switching delay and di/dt value are controlled for variations in process and operating conditions is not known.

SUMMARY OF THE INVENTION

According to the invention, an output buffer is provided which drives the output voltage to the specified logic threshold by the time the voltage is needed and maintains that level with adequate noise margins, as long as required under varying operating conditions, including process, temperature and supply voltage. The delay time is controlled by referencing the delay to the system clock (e.g., 0.75 T, where T equals the clock cycle period). The lead portion of the resulting di/dt for an output signal transition is shaped by controlling the slew rate on the gate of the effective output drive transistor. The lag portion of the resulting di/dt is shaped by controlling the width of the effective output drive transistor.

According to one aspect of the invention, the switching delay is referenced to the clock cycle with a phase-locked loop. The clock signal is fed to the loop generating a data signal transition to a calibration output buffer every Z clock cycles (e.g., 8). The output buffer drives the data signal to a board trace which feeds the signal back into the phase-locked loop to be sampled. The board trace adds a delay equal to the slowest transmission line delay on the board with which the output buffers are to be used. The returning signal is sampled at a certain point during the clock cycle (e.g., 0.75 T). Whether the signal is available by the certain 0.75 T time determines whether digital control signals are increased or decreased so as to increase or decrease the output buffer switching delay. Both the up-going output signal and down-going output signal switching delays are calibrated in this manner to achieve the respective switching delays referenced to the clock cycle. Accordingly, there are digital control signals defining a digitally controlled pull-up operation and independent digital control signals defining a digitally controlled pull-down operation. Varying states on the digital control signal define varying absolute switching delay times. By varying the control signals to achieve a delay of approximately 0.75 T, for example, the absolute delay time is altered according to the process and operating conditions.

According to another aspect of the invention, the di/dt of the output buffer is controlled to vary in step increments as defined by the digital control signals. Thus, the di/dt is defined relative to the delay time. As the delay time increases to maintain, for example, a 0.75 T delay, the di/dt is decreased. Digital control signals define which transistors of a pull-up predriver are switched to contribute to the slew rate and which drive transistors are driven to contribute to the effective drive transistor width during a pull-down operation. Similarly, digital control signals define which transistors of a pull-down predriver are switched to contribute to the slew rate and which drive transistors are driven to contribute to the effective drive transistor width during a pull-up operation.

According to another aspect of the invention, the turn-off slew rate of a pull-down predriver is dependent on the turn-on slew rate of a pull-up predriver, and vice versa to minimize the short circuit current between drive transistors that are switching on and drive transistors that are switching off. The respective turn-off rates of the predrivers are just fast enough to minimize the short circuit current, while being just slow enough to minimize the turn-off di/dt spike.

DESCRIPTION OF THE PREFERRED EMBODIMENT

Output Buffer Overview

Figure 4:
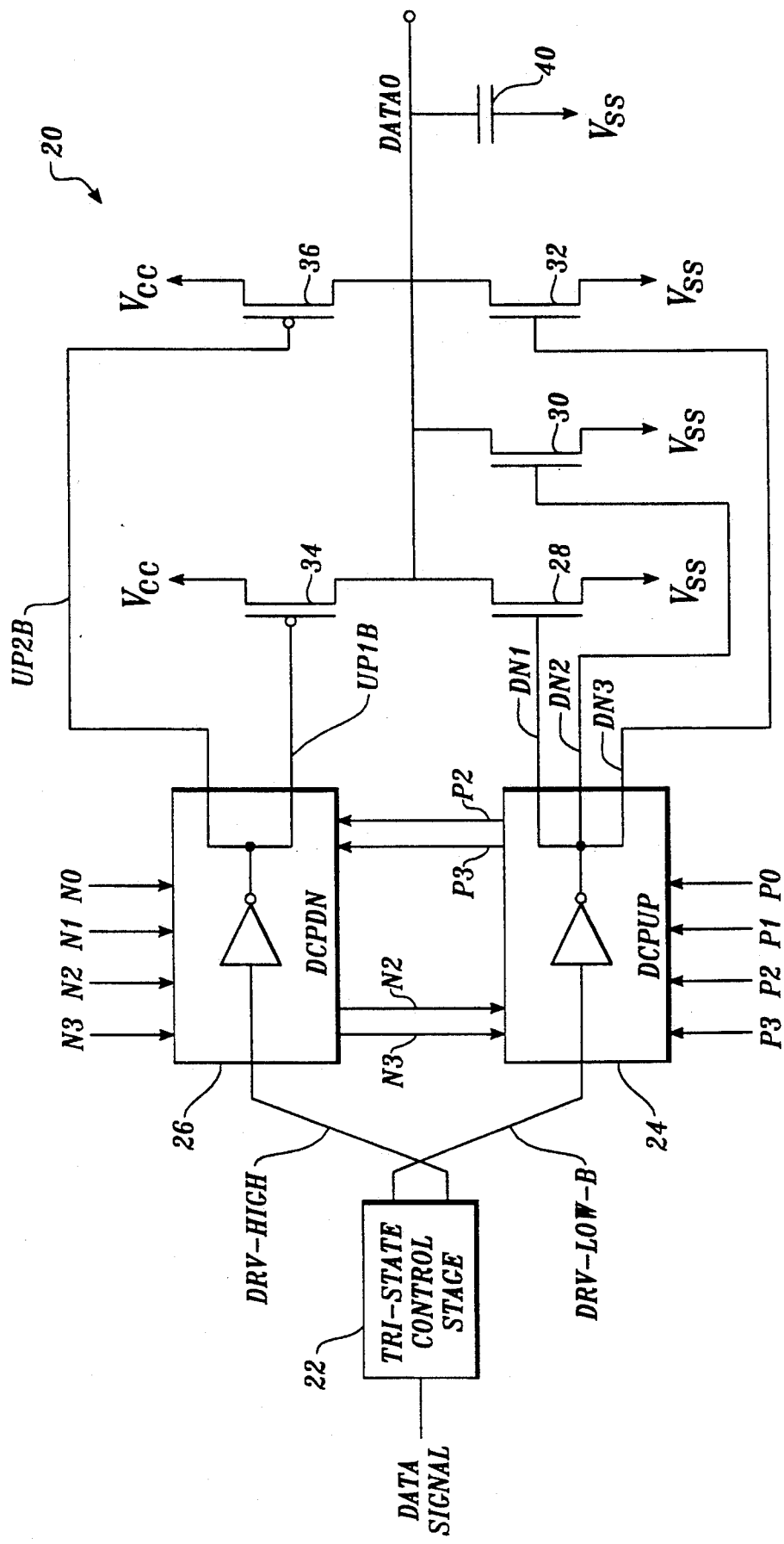
FIG. 4 is a schematic of an output buffer embodiment according to this invention.

Referring to FIGS. 4-6, an output buffer 20 according to this invention is shown. The function of the output buffer 20 is to drive an output signal to at least one load device within an acceptable switching delay time and noise margin. The switching delay time is referenced to the clock cycle to be, for example, 0.75 T, where T equals the clock cycle period. The reference value may be designed to be any fraction of T, although values within the range 0.5 T to 1.0 T are preferred for most applications of an output buffer 20.

Referring to FIG. 4, the output buffer 20 includes a tri-state control stage 22 which passes a data signal to a pull-up predriver 24 and a pull-down predriver 26 as data signals drv-low-B and drv-high, respectively. The pull-up predriver 24 turns on at least one of transistors 28, 30, 32 for an output buffer 20 transition from a logic "1" to a logic "0". (Note that because CMOS transistors are being used the transition from a logic "1" to a logic "0" is a pull-down transition). Control signals P0-P3 determine which one or more of the drive transistors 28, 30, 32 are turned on and define the corresponding turn-on slew rate. The actual driven transistors 28, 30, and-/or 32 define the effective drive transistor width.

Similarly, the pull-down predriver 26 turns on at least one of transistors 34, 36 for an output buffer transition from a logic "0" to a logic "1". (Note that because CMOS transistors are being used, the transition from a logic "0" to a logic "1" is a pull-up transition). Control signals N0-N3 determine which one or more of the drive transistors 34, 36 are turned on and define the corresponding turn-on slew rate. The actual driven transistors 34 and/or 36 define the effective drive transistor width.

To minimize any short circuit current which might occur between drive transistors that are turning on and drive transistors that are turning off, the pull-down predriver 26 control signals N2-N3 also are input to the pull-up predriver 24 for controlling the slew rate for turning off drive transistors 28, 30. Similarly, the pull-up predriver 24 control signals P2-P3 also are input to the pull-down predriver 26 for controlling the slew rate for turning off drive transistors 34, 36. Thus, the turn-off slew rate of the pull-up predriver 24 is dependent on the turn-on slew rate of the pull-down predriver 26, and vice versa.

The defined pull-up predriver 24 turn-on slew rate determines the di/dt curve lead portion for the turn-on transition of drive transistor 28, 30, 32, while the defined predriver 24 turn-off slew rate determines the di/dt curve lead portion for the turn-off transition of drive transistors 28, 30, 32. Similarly, the defined pull-down predriver 26 turn-on slew rate determines the di/dt curve lead portion for the turn-on transition of drive transistors 34, 36, while the defined predriver 26 turn-off slew rate determines the di/dt curve lead portion for the turn-off transition of drive transistors 34, 36. The digital control signals P0 to P3 and N0 to N3 are continuously redefined (i.e., every 16 clock cycles) to control the di/dt curves and switching delay times for variations in process and operating conditions.

The lag portion shapes of the respective di/dt curves, are determined by the transistor width of the selected drive transistors 28, 30, 32, 34, 36.

When switching the output from a logic "0" to a logic "1" state (e.g., a turn-on transition), the load capacitor 40 is charged. When switching from a logic "1" to a logic "0" state (e.g., a turn-off transition), the load capacitor 40 is discharged. The charge or discharge time corresponds to a switching time delay and may result in a current spike defined by L di/dt as discussed in the Background. The capacitance of the output buffer 20 load capacitor 40 may vary according to each implementation. A typical value range is 30 pico-Farads (pF) to 200 pF, although other capacitances may be used. As previously described, lowering the capacitance is one approach for improving the switching delay caused by the charging or discharging of the load capacitor 40. The minimum load capacitance is limited based upon the load capacitances of the devices to be driven by the output buffer.

Digitally-Controlled Pull-Up Predriver

Referring to FIG. 4, the pull-up predriver 24 receives a plurality of digital control signals P0 to P3 which define a turn-on slew rate and a plurality of control signals N2 to N3 which define a turn-off slew rate. The control signals P0-P3 select output drive signals DN1, DN2, and DN3 which drive transistors 28, 30, and 32, respectively, for the turn-on transition of the pull-up predriver 24. The control signals N2-N3 determine the turn-off slew rate for the signals DN1, DN2 and thus for the respective drive transistors 28, 30 receiving such signals.

Figure 5A:
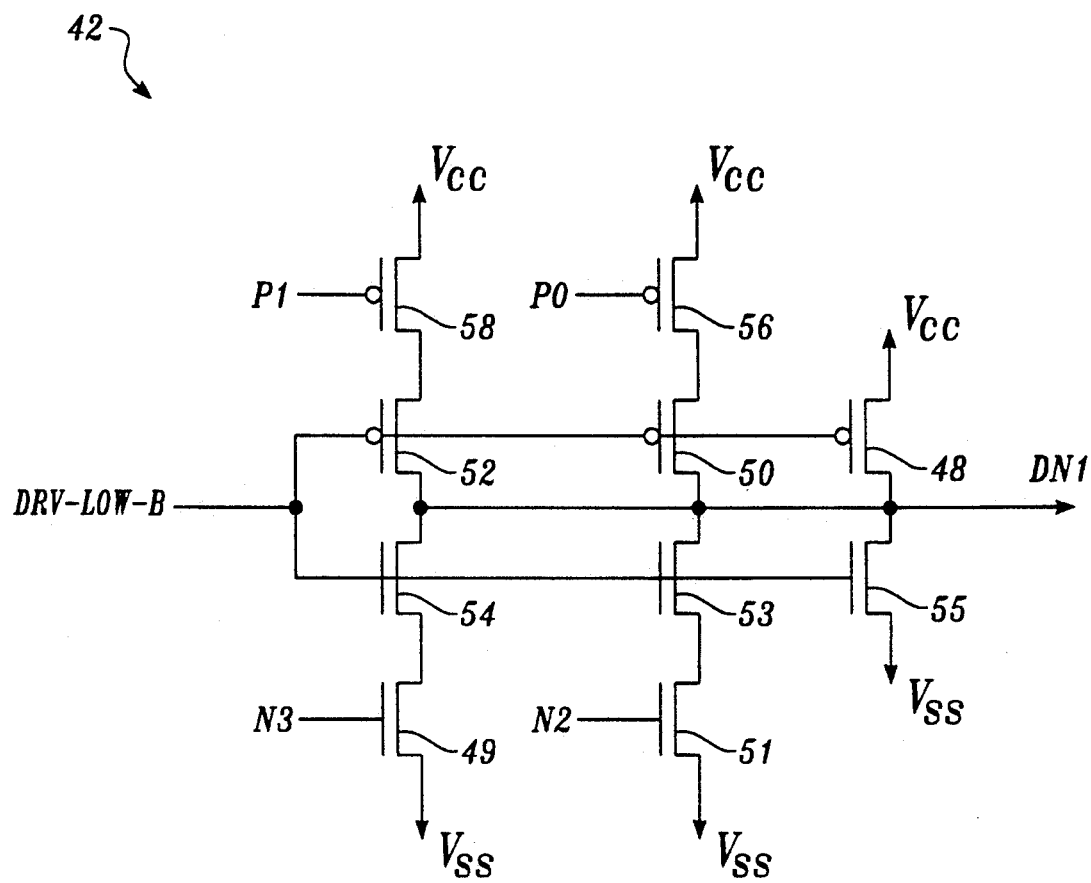
FIGS. 5(a)-5(c) are schematics for a slew rate controlled pull-up predriver for the output buffer of FIG. 4.
Figure 5B:
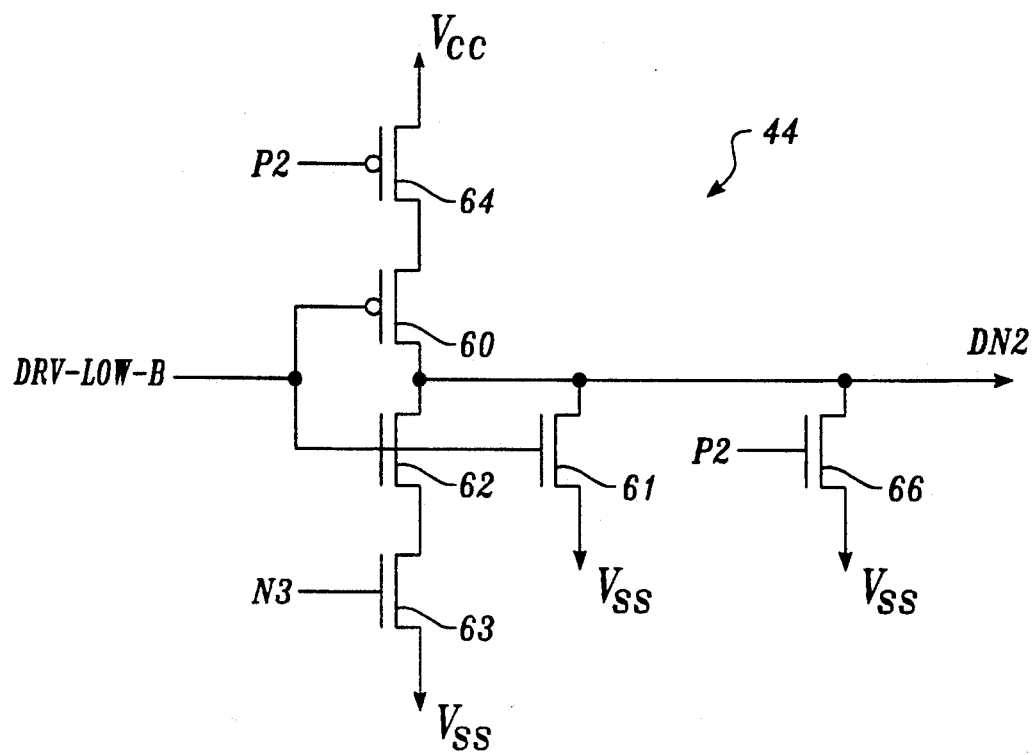
Figure 5C:
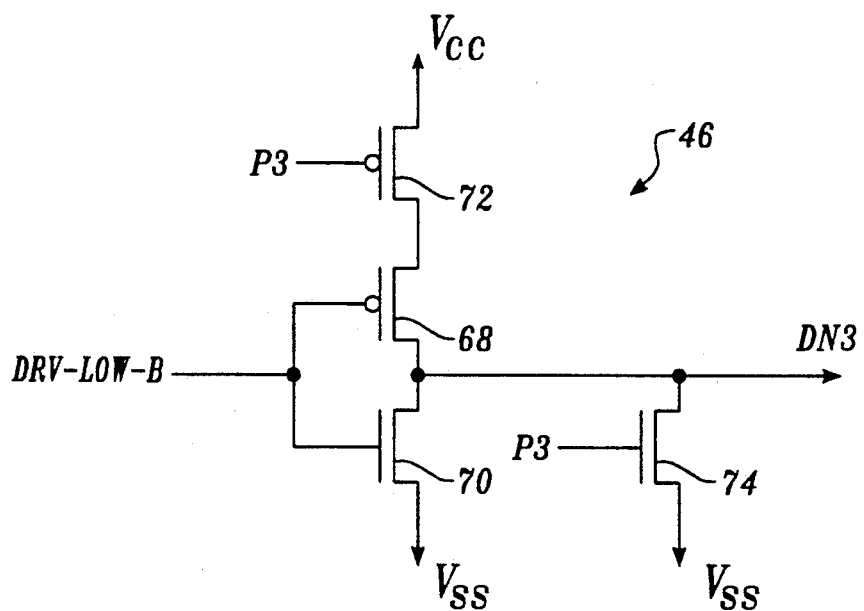

Referring to FIGS. 5a-c, the pull-up predriver 24 is shown as three component gates 42, 44, 46 which produce the respective signals DN1, DN2 and DN3. Gate 42 (FIG. 5a) receives the P0 and P1 control signals, N2 and N3 control signals and the data drv-low-B signal to generate the signal DN1. For a turn-on transition, control signals P0 and P1 determine the slew rate for the lead portion of signal DN1. For a turn-off transition, control signals N2 and N3 determine the slew rate for the lead portion of signal DN1.

Gate 44 (FIG. 5b) receives the P2 and N3 control signals, along with the data drv-low-B signal to generate the signal DN2. For a turn-on transition, control signal P2 determines the slew rate for the lead portion of signal DN2. For a turn-off transition, control signal N3 determines the slew rate for the lead portion of signal DN2.

Gate 46 (FIG. 5c) receives the P3 control signal along with the data drv-low-B signal to generate the signal DN3. For a turn-on transition, control signal P3 determines the slew rate for the lead portion of signal DN3. For a turn-off transition, the slew rate for the lead portion of signal DN3 is defined by the slew rate for the transistor 32, without variation through a control signal.

Gate 42

Referring to FIG. 5a, the gate 42 includes three parallel pull-down devices formed from NMOS transistors 49, 51, 53, 54 and 55 and three parallel pull-up devices formed from PMOS transistors 48, 50, 52, 56, and 58. PMOS transistors 48, 50 and 52 and NMOS transistors 53, 54, and 55 each receive the data drv-low-B signal input at their respective gates. A PMOS pull-up transistor 56 receives at its gate the P0 signal which defines the on or off state of transistor 50. A PMOS pull-up transistor 58 receives at its gate the P1 signal which defines the on or off state of transistor 52. An NMOS pull-down transistor 51 receives at its gate the N2 signal which defines the on or off state of transistor 53. An NMOS pull-down transistor 49 receives at its gate the N3 signal which defines the on or off state of transistor 54.

Gate 42 Pull-Up Transition

For the pull-up transition (e.g., turn-on transition), PMOS transistor 48 always goes high whenever the data drv-low-B signal goes low. Transistor 48 is sized so that its output slew rate, when driving NMOS transistor 28, generates the maximum di/dt allowed for the output buffer 20 under the fastest process and operating conditions. As the process and operating conditions get slower, either or both of the series pull-up devices (transistors 50, 56 as one and transistors 52, 58 as another) also are turned on by setting the corresponding control signals P0 and P1 to be low when the data drv-low-B signal goes low. This increases the turn-on slew rate of signal DN1 and causes NMOS transistor 28 to drive harder.

For given process and operating conditions, the di/dt will increase as P0 and P1 are activated. PMOS transistors 50, 56 are sized so that they will increase the di/dt by X mA/ns (e.g., 8 mA/ns) when activated. PMOS transistors 52, 58 are sized so that they will increase the di/dt by 2X mA/ns (e.g., 16 mA/ns) when activated. The number and respective strengths of transistors 48, 50 and 52 which are switched defines the switching slew rate and di/dt curve lead portion.

The gate 42 output signal DN1 drives transistor 28 (FIG. 4) defining a portion of the effective output drive transistor's width. Regardless of the state of control signals P0 and P1, transistor 28 is driven to form a portion of the output transistor width.

Gate 42 Pull-Down Transition

For the pull-down transition (e.g., turn-off transition), NMOS transistor 55 always becomes active whenever the data drv-low-B signal goes high. Transistor 55 is sized so that its output slew rate, when driving NMOS transistor 28 off, generates the maximum di/dt allowed for the output buffer 20 under the fastest process and operating conditions. As the process and operating conditions get slower, either or both of the series pull-down devices (transistors 51, 53 as one and transistors 49, 54 as another) also would be turned on. This increases the turn-off slew rate of signal DN1 and causes NMOS transistor 28 to turn off harder.

Gate 44

Referring to FIGS. 4 and 5b, the gate 44 and NMOS transistor 30 for a pull-up transition (turn-on transition), increase the output buffer 20 strength, speed and di/dt when P2 is activated (i.e., driven low). The additional width provided by transistor 30 allows the lagging di/dt edge to be shaped to better approximate the ideal di/dt waveform.

Referring to gate 44 at FIG. 5b, PMOS transistor 60 and NMOS transistors 61, 62 receive the data drv-low-B signal at their respective gates. The control signal P2 is input to the gate of a pull-up PMOS transistor 64 to define the on or off state of PMOS transistor 60. The control signal P2 also is input to the gate of transistor 66. The control signal N3 is input to the gate of a pull-down transistor 63 to define the on or off state of NMOS transistor 62.

Gate 44 Pull-Up Transition

Gate 44 is turned on whenever control signal P2 is active and the drv-low-B signal goes low. The control signal P2 is input to transistor 66 to define the state of transistor 66 and thus insure that NMOS transistor 30 is never on, unless P2 is active. When P2 is active, the gate 44 output signal DN2 drives transistor 30 (FIG. 4). When P2 is inactive, the output signal DN2 does not drive transistor 30.

When transistor 30 is on, the width of the effective output transistor is increased so as to add another grade of control to the di/dt lag portion. Accordingly, PMOS transistors 60, 64 in conjunction with NMOS transistor 30 (FIG. 4) are sized so as to increase the turn-on di/dt by 4X mA/ns (e.g., 32 mA/ns) when P2 is active.

Gate 44 Pull-Down Transition

For the pull-down transition, NMOS transistor 61 always goes high whenever the data drv-low-B signal goes high. Transistor 61 is sized so that its output slew rate, when driving NMOS transistor 30 off, generates the maximum di/dt allowed for the output buffer 20 under the fastest process and operating conditions. As the process and operating conditions get slower, the series pull-down device (transistors 62, 63) also would be turned on. This increases the turn-off slew rate of signal DN2 and causes NMOS transistor 30 to turn off harder.

Gate 46

Referring to FIGS. 4 and 5c, the gate 46 and NMOS transistor 32 for the pull-up transition, further increase the output driver strength, speed and di/dt when P3 is activated (i.e., driven low). The additional width provided by transistor 32 allows the lagging di/dt edge to be shaped to better approximate the ideal di/dt waveform.

Referring to gate 46 at FIG. 5c, PMOS transistor 68 and NMOS transistor 70 receive the data drv-low-B signal at their respective gates. The control signal P3 is input to the gate of a pull-up PMOS transistor 72 to define the on or off state of PMOS transistor 68. PMOS transistors 68, 72 in conjunction with NMOS transistor 32 (FIG. 4) are sized so as to increase the di/dt by 8X mA/ns (e.g., 64 mA/ns) when P3 is active. The control signal P3 also is input to the gate of NMOS transistor 74 to insure that NMOS transistor 32 is never on, unless P3 is active. When P3 is active, the gate 46 output signal DN3 turns on transistor 32 (FIG. 4). When P3 is inactive, the output signal DN3 does not turn on transistor 32. When transistor 32 is on, the width of the effective output transistor is increased adding another grade of control to the di/dt lag portion.

Predriver 24 Turn-On Slew Rate

The binary encoding formed by the digital control signals P0 to P3 define which transistors are active to contribute to the turn-on switching delay for the pull-up transition. Table 1 below shows the di/dt values for the fastest case process and operating conditions for each state of the binary encoded P0 to P3 lines, where transistor 48 introduces a 25 mA/ns delay and X = 8 mA/ns.

TABLE 1

| P3 | P2 | P1 | P0 | Total di/dt |
|---|---|---|---|---|
| 1 | 1 | 1 | 1 | 25 mA/ns |

TABLE 1-continued

| P3 | P2 | P1 | P0 | Total di/dt |
|----|----|----|----|-------------|
| 1  | 1  | 1  | 0  | 33 mA/ns    |
| 1  | 1  | 0  | 1  | 41 mA/ns    |
| 1  | 1  | 0  | 0  | 49 mA/ns    |
| 1  | 0  | 1  | 1  | 57 mA/ns    |
| 1  | 0  | 1  | 0  | 65 mA/ns    |
| 1  | 0  | 0  | 1  | 73 mA/ns    |
| 1  | 0  | 0  | 0  | 81 mA/ns    |
| 0  | 1  | 1  | 1  | 89 mA/ns    |
| 0  | 1  | 1  | 0  | 97 mA/ns    |
| 0  | 1  | 0  | 1  | 105 mA/ns   |
| 0  | 1  | 0  | 0  | 113 mA/ns   |
| 0  | 0  | 1  | 1  | 121 mA/ns   |
| 0  | 0  | 1  | 0  | 129 mA/ns   |
| 0  | 0  | 0  | 1  | 137 mA/ns   |
| 0  | 0  | 0  | 0  | 145 mA/ns   |

Accordingly, the slew rate for a pull-up transition of the output buffer 20 (logic "1" to logic "0" transition) is controllably defined by the signals P0 to P3. By varying the value for X or the number of P control lines (and corresponding gate circuits), the range and step intervals for di/dt may be altered. The binary encoding formed by P0 to P3 also define which drive transistors are used, thus defining the width of the effective drive transistor (i.e., the sum of the widths of the component drive transistors 28, 30, and 32 which are driven). According to this approach, the output line impedance of the output buffer 20 may closely match the resident circuit board's transmission line impedance.

Pull-Down Transistor Width

The transistor width for a pull-down transition of output buffer 20 (logic "1" to logic "0"), is defined by the number of drive transistors 28, 30, 32 selected by control signals P0-P3. The effective transistor width determines the shape of the lag portion of the di/dt curve. Thus, control of the effective switching transistor width provides control over the lag portion of the di/dt curve.

Digitally-Controlled Pull-Down Predriver

Referring to FIG. 4, the pull-down predriver 26 receives a plurality of digital control signals N0 to N3 which define a turn-on slew rate and a plurality of control signals P2 to P3 which define a turn-off slew rate. The control signals N0-N3 select output drive signals UP1B and UP2B which drive transistors 34 and 36, respectively for the turn-on transition of the pull-down predriver 26. The control signals P2-P3 determine the turn-off slew rate for the signals UP1B, UP2B which turn off the respective drive transistors 34, 36.

Figure 6A:
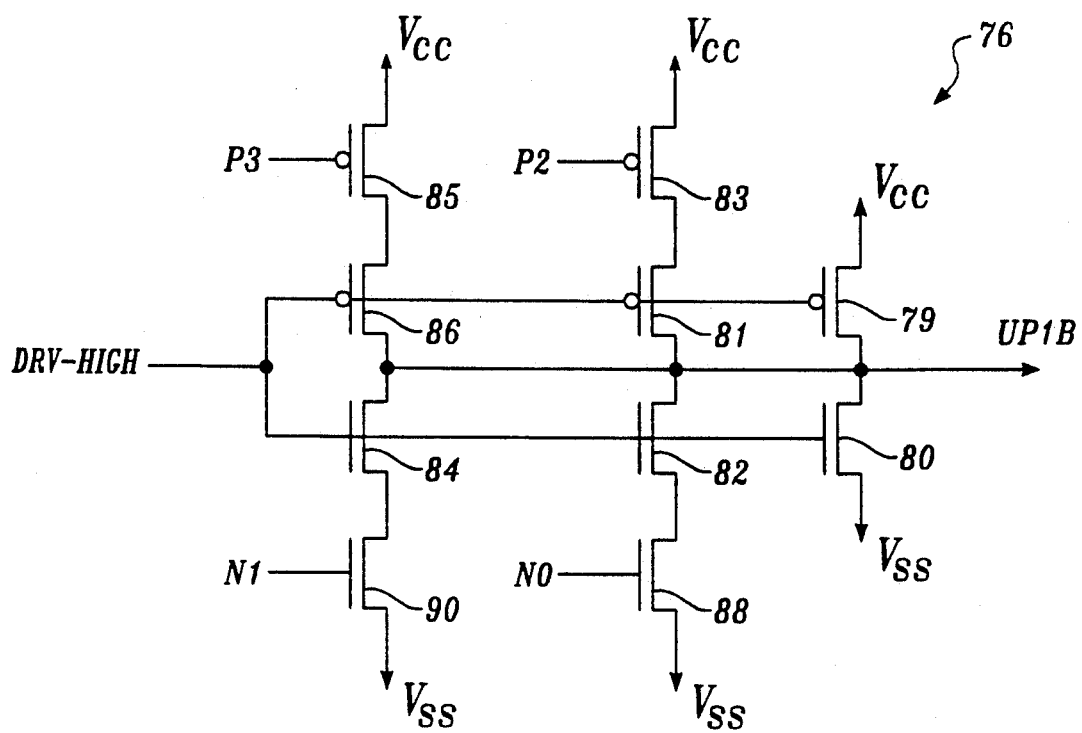
FIGS. 6(a)-6(b) are schematics for a slew rate controlled pull-down predriver for the output buffer of FIG. 4.
Figure 6B:
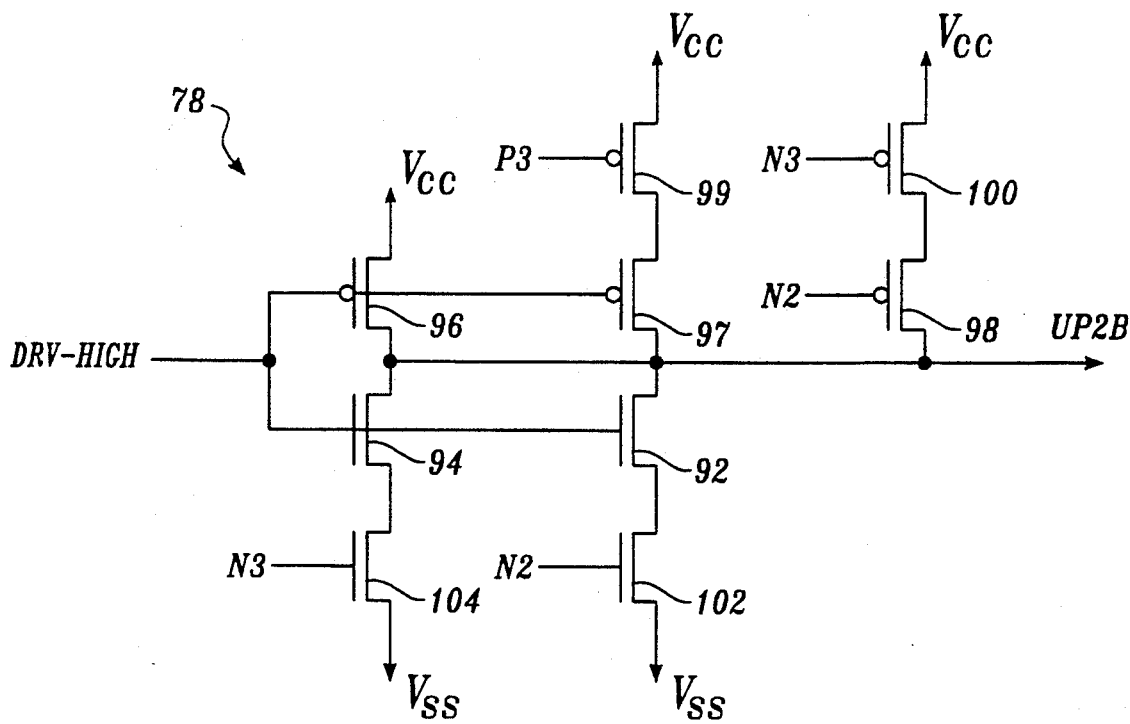

Referring to FIGS. 6a-b, the pull-down predriver 26 is shown as two component gates 76, 78 which produce respective signals UP1B and UP2B. Gate 76 (FIG. 6a) receives the N0, N1, P2 and P3 control signals, along with the data drv-high signal to generate the signal UP1B. Gate 78 (FIG. 6b) receives the N2, N3 and P3 control signals, along with the data drv-high signal to generate the signal UP2B.

Gate 76

Referring to FIG. 6a, the gate 76 includes three parallel pull-down devices formed from NMOS transistors 80, 82, 84, 88, and 90 and three parallel pull-up devices formed from PMOS transistors 79, 81, 83, 85, and 86. NMOS transistors 80, 82, 84 and PMOS transistors 79, 81, 86 each receive the data drv-high signal input at their respective gates. An NMOS pull-down transistor 88 receives at its gate the N0 signal which defines the on or off state of transistor 82. An NMOS pull-down transistor 90 receives at its gate the N1 signal which defines the on or off state of transistor 84. A PMOS pull-up transistor 83 receives at its gate the P2 signal which defines the on or off state of transistor 81. A PMOS pull-up transistor 85 receives at its gate the P3 signal which defines the on or off state of transistor 86.

Gate 76 Pull-Down Transition

For the pull-down transition (turn-on transition of predriver 26), NMOS transistor 80 always turns on and pulls the UP1B signal low whenever the data drv-high signal goes high. Transistor 80 is sized so that its output slew rate, when driving PMOS transistor 34, generates the maximum di/dt allowed for the output buffer 20 under the fastest process and operating conditions. As the process and operating conditions get slower, either or both of the series pull-down devices (transistors 82, 88 as one and transistors 84, 90 as another) also would be turned on by setting the corresponding control signals N0, N1 to be high when the data drv-high signal goes high. This increases the turn-on slew rate of signal UP1B and causes PMOS transistor 34 to drive harder.

For given process and operating conditions, the di/dt will increase as N0 and N1 are activated. NMOS transistors 82, 88 are sized so that they will increase the di/dt by X mA/ns (e.g. 8 mA/ns) when activated. NMOS transistors 84, 90 are sized so that they will increase the di/dt by 2X mA/ns (e.g., 16 mA/ns) when activated. The number and respective strengths of transistors 80, 82, 84 which are switched defines the switching slew rate and di/dt curve lead portion.

The gate 76 output signal UP1B drives transistor 34 (FIG. 4) defining a portion of the effective output drive transistor's width. Regardless of the state of control signals N0 and N1, transistor 34 is driven to form a portion of the output transistor width for the active transition of drv-high.

Gate 76 Pull-Up Transition

For the pull-up transition, PMOS transistor 79 always turns on whenever the data drv-high signal goes low. Transistor 79 is sized so that its output slew rate, when driving PMOS transistor 34 off, generates the maximum di/dt allowed for the output buffer 20 under the fastest process and operating conditions. As the process and operating conditions get slower, either or both of the series pull-up devices (transistors 81, 83 as one and transistors 85, 86 as another) also would be turned on. This increases the turn-off slew rate of signal UP1B and causes PMOS transistor 34 to turn off harder.

Gate 78

Referring to FIGS. 4 and 6b, the gate 78 and PMOS transistor 36, for a pull-down transition increase the output driver strength, speed and di/dt when N2 or N3 is activated. The additional width provided by transistor 36 allows the lagging di/dt edge to be shaped to better approximate the ideal di/dt waveform.

Referring to gate 78 at FIG. 6b, NMOS transistors 92 and 94 along with PMOS transistors 96 and 97 receive the data drv-high signal at their respective gates. The control signal N2 is input to the gate of a pull-down NMOS transistor 102 to define the on or off state of NMOS transistor 92. The control signal N3 is input to the gate of a pull-down NMOS transistor 104 to define the on or off state of NMOS transistor 94. The control signals N2 and N3 also are input to the gates of PMOS transistors 98 and 100. The control signal P3 is input to the gate of pull-up PMOS transistor 99 to define the on or off state of PMOS transistor 97.

Gate 78 Pull-Down Transition

Gate 78 undergoes a pull-down transition (e.g., ongoing transition; active transition) whenever control signals N2 or N3 are active drv-high undergoes an active transition. Whenever N2 or N3 are active, transistor 98 or 100, respectively, turn off, thus allowing signal UP2B to drive transistor 36 on. Transistors 98 and 100 insure that transistor 36 never is on unless either or both of control signals N2 and N3 are active.

Figure 1:
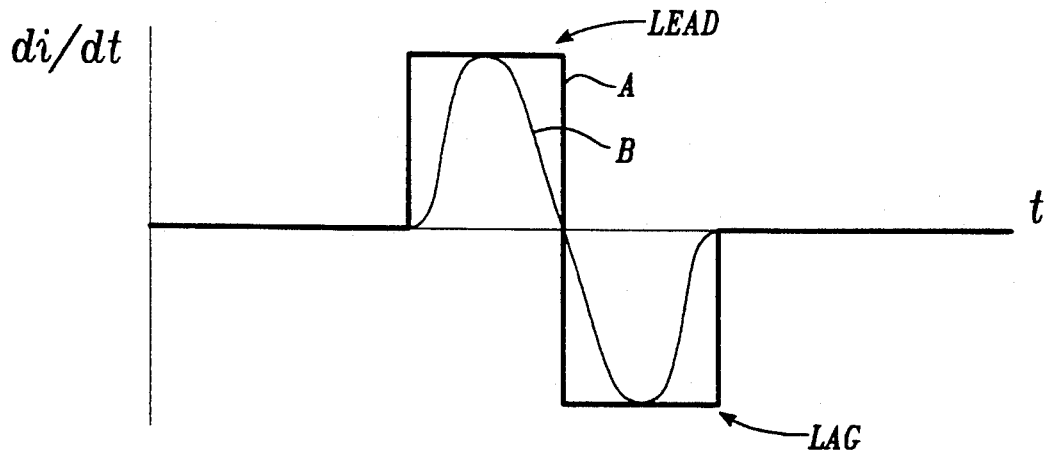
FIG. 1 is a graph comparing the actual di/dt curve of a conventional output buffer with the ideal theoretical di/dt curve.
Figure 2:
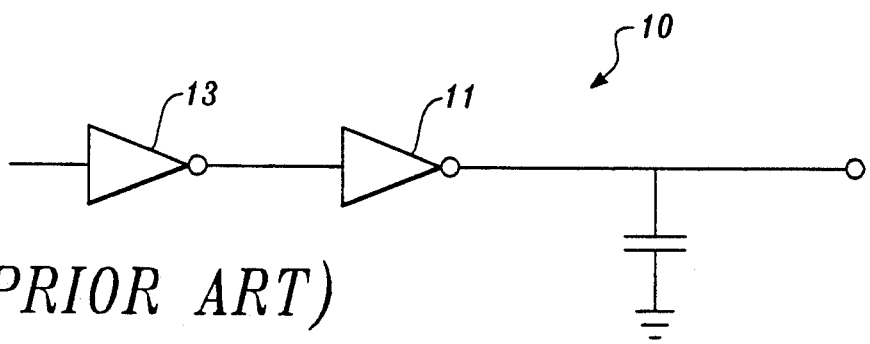
FIG. 2 is a schematic of a conventional output buffer having an inverter for a predriver.
Figure 3:
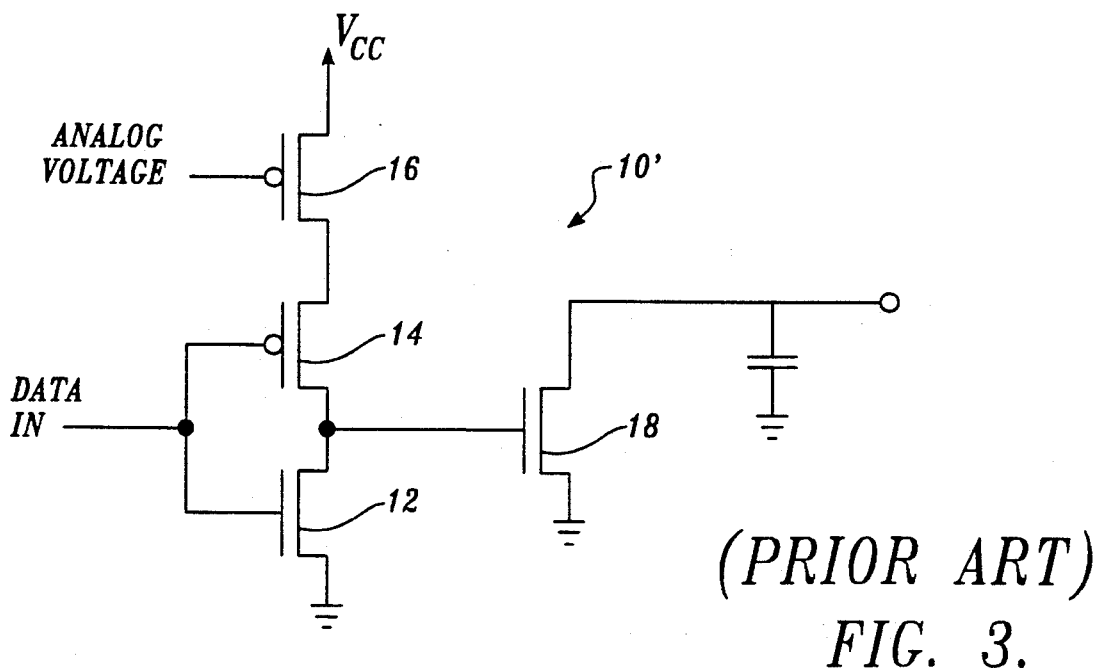
FIG. 3 is a schematic of a pull-down portion of a conventional output buffer in which an analog voltage is used to control the slew rate of the drive transistor.

When N2 and drv-high are active, transistor 92 and 102 are turned on. NMOS transistors 92, 102 in conjunction with PMOS transistor 36 (FIG. 4) are sized so as to increase the di/dt by 4X mA/ns (e.g., 32 mA/ns) when N2 is active. Similarly, the control signal N3 is input to the gate of transistor 104 to define the on or off state of NMOS transistor 94. NMOS transistors 94, 104 in conjunction with PMOS transistor 36 (FIG. 4) are sized so as to increase the di/dt by 8X mA/ns (e.g., 64 mA/ns) when N3 is active. Thus, when either or both of control signals N2 and N3 are active, the gate 78 output signal UP2B drives transistor 36 (FIG. 3). When both N2 and N3 are inactive, the output signal UP2B turns transistor 36 off. When transistor 36 is on, the width of the effective output transistor is increased so as to add another grade of control to the di/dt lag portion.

Gate 78 Pull-Up Transition

For the pull-up transition, PMOS transistor 96 always turns on whenever the data drv-high signal goes low. Transistor 96 is sized so that its output slew rate, when driving PMOS transistor 36 off, generates the maximum di/dt allowed for the output buffer 20 under the fastest process and operating conditions. As the process and operating conditions get slower, the series pull-up device (transistors 97, 99) also would be turned on. This increases the turn-off slew rate of signal UP2B and causes PMOS transistor 36 to turn off harder.

Predriver 26 Turn-On Slew Rate

The binary encoding formed by the digital control signals N0 to N3 define which transistors are active to add an X mA/ns delay to the switching speed for a pull-up transition. Table 2 below shows the di/dt under a fastest case process and operating conditions for each state of the binary encoded N0 to N3 lines, where transistor 80 introduces a 25 mA/ns delay and X=8 mA/ns.

TABLE 2

| N3 | N2 | N1 | N0 | Total di/dt |
|---|---|---|---|---|
| 0 | 0 | 0 | 0 | 25 mA/ns |
| 0 | 0 | 0 | 1 | 33 mA/ns |
| 0 | 0 | 1 | 0 | 41 mA/ns |
| 0 | 0 | 1 | 1 | 49 mA/ns |
| 0 | 1 | 0 | 0 | 57 mA/ns |
| 0 | 1 | 0 | 1 | 65 mA/ns |
| 0 | 1 | 1 | 0 | 73 mA/ns |
| 0 | 1 | 1 | 1 | 81 mA/ns |
| 1 | 0 | 0 | 0 | 89 mA/ns |
| 1 | 0 | 0 | 1 | 97 mA/ns |
| 1 | 0 | 1 | 0 | 105 mA/ns |
| 1 | 0 | 1 | 1 | 113 mA/ns |
| 1 | 1 | 0 | 0 | 121 mA/ns |
| 1 | 1 | 0 | 1 | 129 mA/ns |
| 1 | 1 | 1 | 0 | 137 mA/ns |
| 1 | 1 | 1 | 1 | 145 mA/ns |

Accordingly, the slew rate for a pull-up transition is controllably defined by signals N0 to N3. By varying the value for X or the number of N control lines, the range and step intervals for di/dt may be altered. The binary encoding formed by N0 to N3 also define which drive transistors are on, thus defining the width of the effective drive transistor (i.e., the sum of the widths of the component drive transistors 34, 36 which are driven). According to such approach, the output line impedance of the output buffer may closely match the resident circuit board's transmission line impedance.

Pull-Up Transistor Width

The transistor width for a pull-up transition of output buffer 20 (logic "0" to logic "1"), is defined by the number of drive transistors 34, 36 selected by control signals N0-N3. The effective transistor width determines the shape of the lag portion of the di/dt curve. Thus, control of the effective transistor width provides control over the lag portion of the di/dt curve.

Accordingly, the slew rate and the width of the effective drive transistor are controlled for both an up-going and down-going transition. Thus, the lead and lag portions of the di/dt are controlled to provide an output buffer conforming to a specific noise margin requirement for a given set of process and operating conditions.

To provide control for varying process and operating conditions, the digital control signals P0-P3 and N0-N3 are defined by a negative feedback loop referenced to a clock cycle interval.

Phase-Locked Loop Generation of Control Signals

As the primary criteria for an output buffer is that the output voltage be driven to the specified logic threshold by the time it is needed, the output delay need not be specified to be some constant value. To allow for process and operating condition variations, including temperature and supply voltage variations, the delay according to this invention is defined relative to the frequency of the system in which the output buffer is configured. For example, the delay may be one clock cycle, less the input buffer delay and the input latch set-up time.

Figure 7:
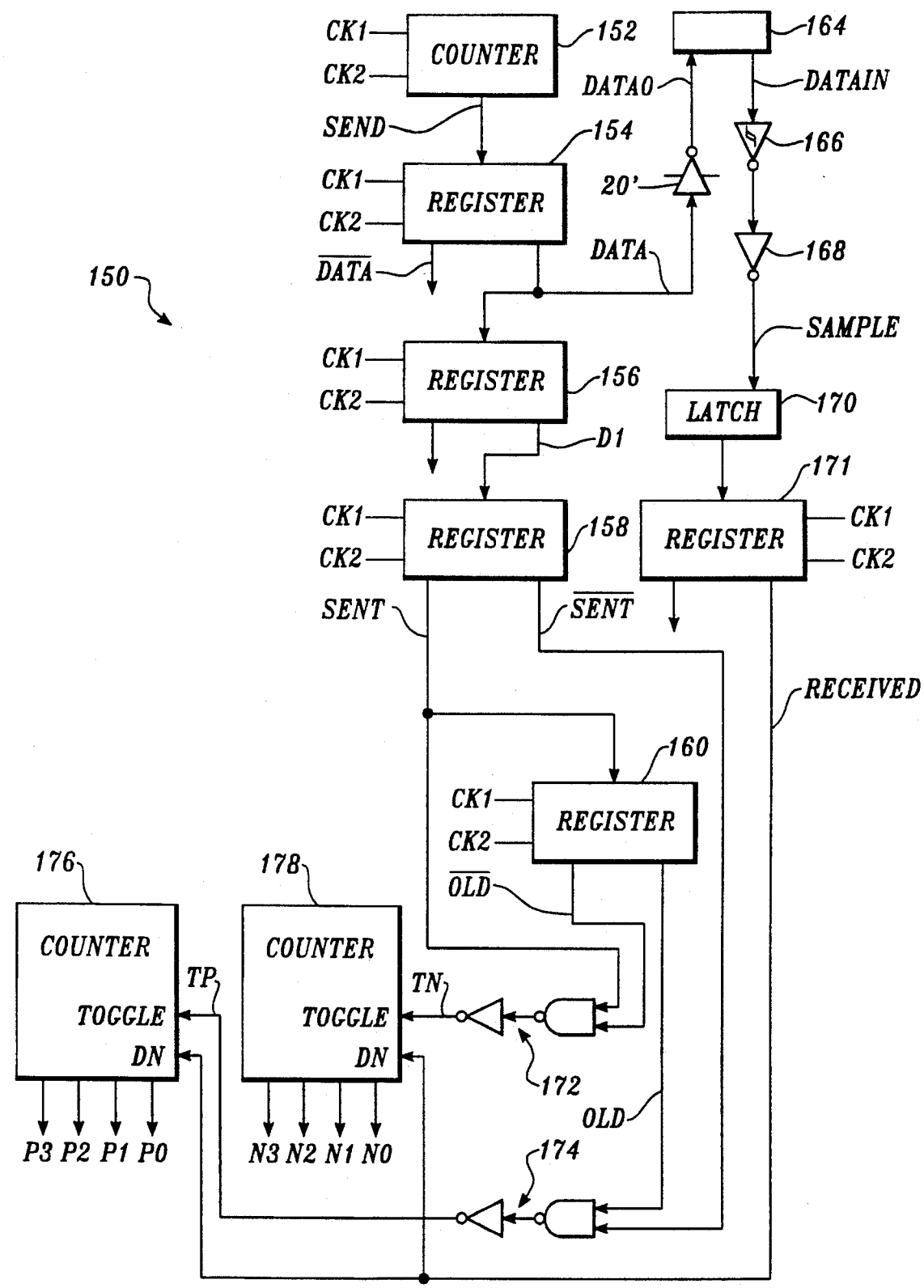
FIG. 7 is a schematic of a phase-locked loop which generates the digital control signals for regulating the switching delay and di/dt of the output buffer of FIG. 4.

According to a preferred embodiment of this invention, the delay is regulated using a negative feedback loop. Referring to FIG. 7, a digital control signal generation circuit 150—in effect, a phase-locked loop referenced to the system clock—is shown. The circuit 150 receives system clock phase 1 and phase 2 signals CK1 and CK2 as inputs and generates in response the digital control signals P0 to P3 and N0 to N3. The circuit 150 references the control signals to the system clock to generate the appropriate P0 to P3 and N0 to N3 digital control signals for maintaining the output buffer 20 delay at approximately 0.75 T, where T is the clock cycle period. Other clock cycle reference times, such as 0.5 T or 1.0 T, may be used instead. The P0 to P3 and N0 to N3 control signals are updated every 16 clock cycles, with an 8 clock cycle offset between the updating of the P0 to P3 control signals and the updating of the N0 to N3 control signals. Thus, an update occurs every 8 clock cycles, alternating between the P and N control signals.

Referring to FIG. 7, the circuit 150 includes a divide-by-8 counter 152, edge triggered shift registers 154, 156, 158, 160 and 171, an output buffer 20' for driving a board trace 164, a Schmitt trigger 166 and inverter 168, a sampling circuit 170, logic gates 172, 174 and saturating up/down counters 176, 178. The output buffer 20' is of the same type as the output buffer 20 of FIG. 4. To determine the control signals for all the output buffers on an integrated circuit chip, an output buffer 20' is used in conjunction with the circuit 150.

Figure 8:
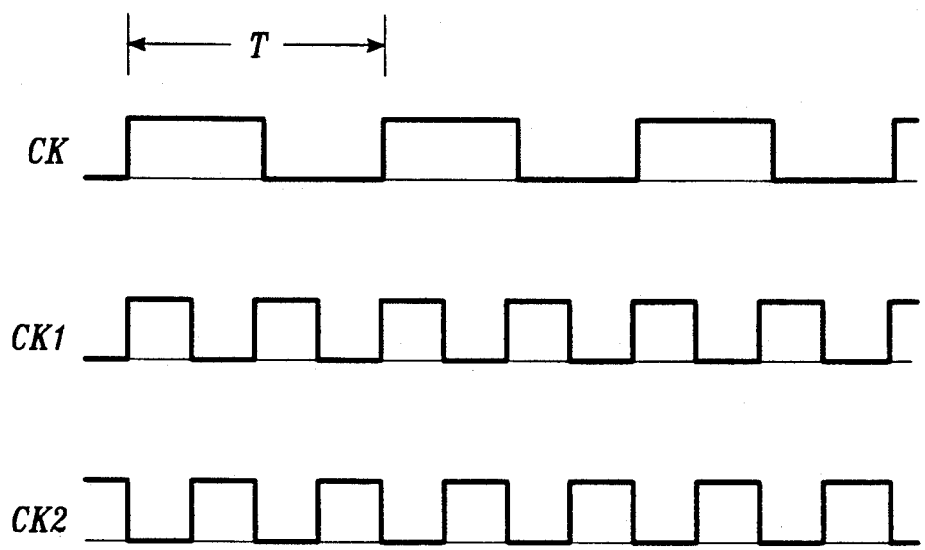
FIG. 8 is a timing diagram comparing a system clock and the phase 1 and phase 2 signals thereof.
Figure 9:
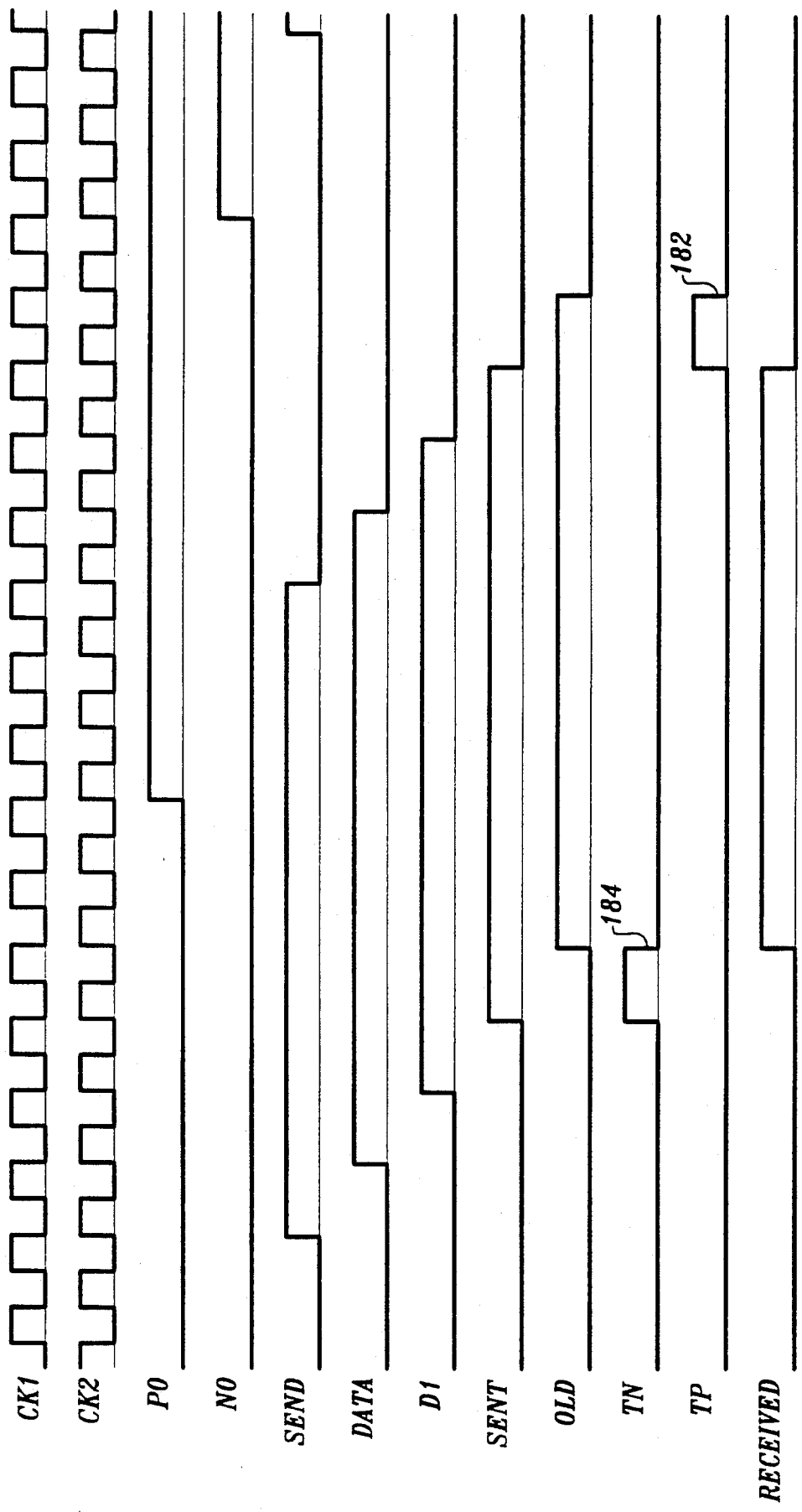
FIG. 9 is a timing diagram showing the relative timing between various signals generated by the phase-locked loop of FIG. 7.

The system clock is input to the divide-by-8 counter 152 and edge triggered registers 154, 156, 158, 160 and 171 as both a phase 1 and a phase 2 signal. Referring to FIG. 8, a timing diagram is shown to compare the clock signal CK with the phase 1 clock signal CK1, and the phase 2 clock signal CK2. The divide-by-8 counter generates a transition in its output signal every 8 clock cycles. The divide-by-8 counter 152 output signal SEND is received by an edge triggered register 154. The register 154 is synchronized to generate a pulse transition at the beginning of a phase 1 clock signal CK1 pulse. Thus, as shown in FIG. 9, every 8 clock cycles the register 154 DATA signal output undergoes a pulse transition synchronized to the phase 1 clock signal CK1.

The DATA signal is input to edge-triggered register 156 which generates signal D1. On the next clock pulse after DATA undergoes a transition, D1 undergoes a transition. The D1 signal is input to edge-triggered register 158 which generates a SENT signal. On the next clock pulse after D1 undergoes a transition, SENT undergoes a transition. The SENT signal is input to edge-triggered register 160 which generates signal OLD. On the next clock cycle after SENT undergoes a transition, OLD undergoes a transition. Referring to FIG. 9, the relative signal transitions are shown for SEND, DATA, D1, SENT and OLD. As shown in FIG. 9, when counter 152 generates an up-going transition, DATA goes high one clock cycle later, D1 goes high 2 clock cycles later, SENT goes high 3 clock cycles later, and OLD goes high 4 clock cycles later, each transition synchronized to the beginning of the phase 1 clock cycle.

The signals OLD and OLD bar generated by register 160 are input to respective logic circuits 172 and 174 which output signals TN and TP to counter 178, 176, respectively. Logic circuits 172 generate a pulse in signal TN during the clock cycle between the up-going transitions of SENT and OLD. See FIGS. 9 and 10. Logic circuits 174 generate a pulse in signal TP during the clock cycle between the down-going transitions of SENT and OLD. The signals TN and TP are coupled to the respective toggle inputs of counters 178 and 176 causing the respective counters to count one clock cycle after the trailing edge of the respective toggle pulse.

The count direction (i.e., up or down) is set at the DN pin which receives the signal RECEIVED output from register 171. The RECEIVED signal is derived from the DATA signal. The DATA signal is fed to the output driver 20' which outputs DATA to a board trace 164. The board trace 164 is determined by the system designer of the system in which the output buffer 20 is to be used. Preferably, the board trace 164 is selected by the designer to have the same characteristics as the slowest trace on the board. The board trace 164 causes the signal to be delayed by a specified amount, then fed back through the Schmitt trigger 166. The input signal to the Schmitt trigger 166 is the DATAIN signal. The Schmitt trigger's output signal is input to the inverter 168 which generates a SAMPLE signal. The SAMPLE signal is sampled by a D-latch 170 or other sampling device which samples according to this embodiment at the 0.75 T time, where T is one clock cycle period. Thus, to assure that an output signal is available from an output buffer 20 to other circuits, the combined delay of the output buffer 20', the prescribed delay induced by the board trace, the input buffer delay and the input signal set-up time is to be less than 0.75 T. The prescribed delay is configured by the board designer to be equal to the slowest transmission line delay on the board.

The sampling device 170 feeds the sampled signal to the edge triggered register 171, which triggers on the leading edge of a phase 1 clock pulse, to generate a RECEIVED signal. The RECEIVED signal thus will undergo a transition at the lead edge or trail edge of a TN or TP pulse as shown in FIG. 9, depending on whether the DATAIN signal is present by the 0.75 T time at the sampling device 170.

The RECEIVED signal is input to the down DN input of each of the up-down counters 167 and 178. If the RECEIVED signal is high during a TN active pulse, the counter 178 counts down. If the RECEIVED signal is low during the TN active pulse, the counter 178 counts up. One clock cycle after the TN pulse goes down, the counter 178 will count in the selected direction creating a new set of N0 to N3 control signals. The transition times of the P3-P0 and N3-N0 signals are offset from the transition time of the data and tri-state control signals by one phase so that they do not switch simultaneously. This prevents the noise control signals from altering the buffer characteristics at the moment the buffer(s) is switching.

Referring to FIG. 9, a timing diagram is shown. Every 8 clock cycles the counter 152 counts generating a transition in the SEND signal. Five clock cycles later, the result is a count transition at either up-down counter 176 or 178 in a direction determined by the level of the input at respective pins DN. Counters 176 and 178 count up if the signal at respective pins DN is low and count down if the signal at pins DN is high. The RECEIVED signal is input to the respective pins DN, and thus, defines the direction of the count. The RECEIVE signal level at the beginning of a respective TN or TP pulse defines the count direction.

Referring to FIG. 9, the RECEIVED signal high-going transition is received too late relative to TN pulse 184. Thus, the DN input is low causing counter 178 to count up. The RECEIVED signal goes high on the subsequent clock cycle, then returns low in time for the TP pulse 182 of counter 176 causing counter 176 also to count up.

Figure 10:
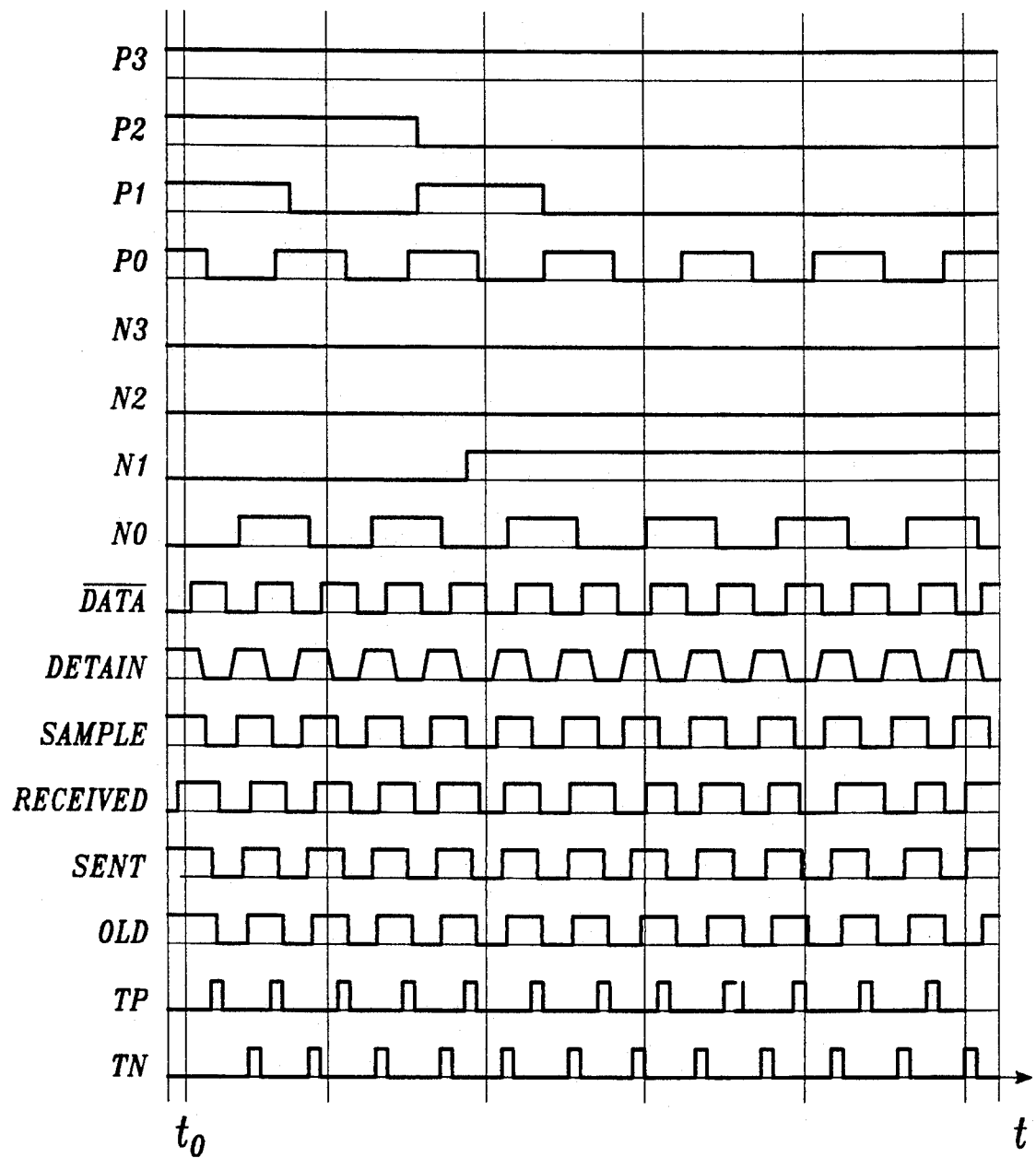
FIG. 10 is a timing diagram showing the changing binary count of the digital control signals.

Referring to FIG. 10, a sequence of digital control signal transitions is shown. Referring to the P0 to P3 signals, the binary value of the signals goes down from "1111" to "1000", then begins toggling back and forth between "1000" and "1001". Comparing the trailing edge of the RECEIVED signal to the TP pulses, the RECEIVED signal is high during the TP pulses for the area where counter 176 counts P3 to P0 down to "1000". Thereafter, the RECEIVED signal is low during a TP pulse, followed by high during the next TP pulse, and back and forth as the counter 176 toggles the P signals between "1000" and "1001".

During the area where the counter 176 is counting down to "1000", the trailing edge of the RECEIVED pulse was not received on time. As a result, the P signals are changed to alter the di/dt and delay time of output buffer 20' (and all other buffers 20 receiving the P control signals) to decrease the delay time for a down-going transition in an output signal DATAO. Once the delay is reduced enough that the output signal DATAO read back in as DATAIN and sampled as signal SAMPLE is available by 0.75 T, the RECEIVED pulse does go low on time and the counter 176 changes direction to count up from "1000" to "1001". This increases the delay once again. On the next pulse the RECEIVED signal is not present on time so the counter 176 counts down again to "1000". The process then continues with the digital control signals P3 to P0 changing every 16 clock cycles between "1000" and "1001" to maintain the output buffer 20, 20' switching time delays at approximately 0.75 T.

Due to variations in operating conditions, the P0 to P3 signal encoding may change thereafter to toggle between "1010" and "1001" to increase the delay and decrease di/dt, or between "1000" and "0111" to decrease the delay and increase di/dt so as to maintain the 0.75 T delay, but at new control signal values.

Referring to the N0 to N3 signals of FIG. 10, the signals count from "0000" to "0011", then toggle back and forth between "0011" and "0010". Comparing the leading edge of the RECEIVED signal and the TN pulses, the RECEIVED signal is low during the TN pulses for the area where counter 178 counts N3 to N0 up to "0011". Thereafter, the RECEIVED signal is high during a TN pulse, followed by low during the next TN pulse, and back and forth thereafter as the counter 178 toggles the N signals between "0011" and "0010".

During the area where the counter 178 is counting up to "0011", the leading edge of the RECEIVED pulse was not present on time. As a result, the N signals are changed to alter the di/dt and delay time of output buffer 20' (and all other buffers 20 receiving the N control signals) to decrease the delay time for an up-going transition in an output signal DATAO. Once the delay is decreased enough that the output signal DATAO read back in as DATAIN and sampled as signal SAMPLE is available by 0.75 T, the RECEIVED pulse goes high on time and the counter 178 changes direction to count down from "0011" to "0010". This increases the delay once again. On the next pulse the RECEIVED signal is not present on time so the counter 178 counts up again to "0011". The process then continues with the digital control signals N3 to N0 changing every 16 clock cycles between "0011" and "0010" to maintain the delay at approximately 0.75 T.

Due to variations in operating conditions, the N0 to N3 signal encoding may change, thereafter to toggle between "0100" and "0011" to decrease the delay and increase di/dt, or between "0010" and "0001" to increase the delay and decrease di/dt so as to maintain the delay at 0.75 T, but at new control signal values.

A negative feedback loop has been described which generates the appropriate P0 to P3 and N0 to N3 control signals for maintaining the switching delay of the output buffers 20 and 20' at 0.75 T, regardless of variations in process or operating conditions. By defining the speed relative to the clock cycle in the di/dt vs. speed tradeoff, a corresponding di/dt is implemented for maintaining the noise due to the current spike, L di/dt, within acceptable noise margins.

The negative feedback loop as described uses one output buffer 20 to derive the control signals P0-P3 and N0-N3. Typically, an integrated circuit for an output buffer will have several buffers on the same chip. Thus, one of the buffers 20 is used for calibrating the control signals, while all the buffers receive the control signals.

Although a preferred embodiment of the invention has been illustrated and described, various alternatives, modifications and equivalents may be used. For example, although a non-inverting buffer has been described, the buffer according to this invention is applicable both to inverting and non-inverting applications. Therefore, the foregoing description should not be taken as limiting the scope of the invention which is defined by the appended claims.

What is claimed is:

1. An output buffer for receiving a data signal and generating a responsive output signal, a response to a transition in the data signal occurring after a controllable switching delay time so that the output signal response is available within a prescribed delay time, the prescribed delay time being referenced to a clock cycle, the output buffer comprising:

a first transitive means for driving the output signal; means receiving said data signal for predriving said first transitive means in response to a transition in the data signal, said predriving means receiving a plurality of digital control signals for determining the switching delay time of the output buffer with reference to a clock cycle; and wherein said switching delay time is referenced to approximately 0.75 T, where T equals one clock cycle period.

2. An output buffer for receiving a data signal and generating a responsive output signal, a response to a transition in the data signal occurring after a controllable switching delay time so that the output signal response is available within a prescribed delay time, the prescribed delay time being referenced to a clock cycle, the output buffer comprising:

a first transitive means for driving the output signal; and means receiving said data signal for predriving said first transitive means in response to a transition in the data signal, said predriving means receiving a plurality of digital control signals for determining the switching delay time of the output buffer with reference to a clock cycle; and means for defining the plurality of digital control signals, said defining means including:

an up/down counting means for generating said plurality of control signals, said counting means counting after a fixed interval of clock cycles to derive said plurality of control signals, the counting means having a directional input signal for defining the count direction, said output signal coupled to said directional input signal, said output signal at a clock cycle reference time defining said directional input signal at the time of counting.

3. The output buffer combination of claim 2 in which said defining means further comprises means receiving said output signal for sampling said output signal at said prescribed delay time to generate said directional input signal, said prescribed delay time corresponding to said clock cycle reference time.

4. An output buffer for receiving a data signal and generating a responsive output signal, a response to a transition in the data signal occurring after a controllable switching delay time so that the output signal response is available within a prescribed delay time, the prescribed delay time being referenced to a clock cycle, the output buffer comprising:

a first transistor means for driving said output signal for a pull-up transition;

a pull-up predriving means for predriving said first transistor means;

a second transistor means for driving said output signal for a pull-down transition;

a pull-down predriving means for predriving said second transistor means;

said pull-up predriving means receiving a plurality of first digital control signals for determining the turn-on slew rate for said first transistor means;

said pull-down predriving means receiving a plurality of second digital control signals for determining the turn-on slew rate for said second transistor means;

said plurality of first control signals and said plurality of second control signals being defined with reference to a clock cycle; and wherein at least one of said plurality of first control signals determine a turn-off slew rate for said second transistor means.

5. An output buffer for receiving a data signal and generating a responsive output signal, a response to a transition in the data signal occurring after a controllable switching delay time so that the output signal response is available within a prescribed delay time, the prescribed delay time being referenced to a clock cycle, the output buffer comprising:

a first transistor means for driving said output signal for a pull-up transition;

a pull-up predriving means for predriving said first transistor means;

a second transistor means for driving said output signal for a pull-down transition;

a pull-down predriving means for predriving said second transistor means;

said pull-up predriving means receiving a plurality of first digital control signals for determining the turn-on slew rate for said first transistor means;

said pull-down predriving means receiving a plurality of second digital control signals for determining the turn-on slew rate for said second transistor means;

said plurality of first control signals and said plurality of second control signals being defined with reference to a clock cycle; and wherein at least one of said plurality of second control signals determine a turn-off slew rate for said first transistor means.

6. An output buffer for receiving a data signal and generating a responsive output signal, a response to a transition in the data signal occurring after a controllable switching delay time so that the output signal response is available within a prescribed delay time, the prescribed delay time being referenced to a clock cycle, the output buffer comprising:

a first transistor means for driving said output signal for a pull-up transition;

a pull-up predriving means for predriving said first transistor means;

a second transistor means for driving said output signal for a pull-down transition;

a pull-down predriving means for predriving said second transistor means;

said pull-up predriving means receiving a plurality of first digital control signals for determining the turn-on slew rate for said first transistor means;

said pull-down predriving means receiving a plurality of second digital control signals for determining the turn-on slew rate for said second transistor means;

said plurality of first control signals and said plurality of second control signals being defined with reference to a clock cycle; and a plurality of first transistor means, in which said pull-up predriving means has an active configuration defined by said plurality of first control signals, said active configuration determining which one or more of said plurality of first transistor means are predriven, said one or more predriven first transistor means determining an effective drive transistor width, the turn-on slew rate for said one or more predriven first transistor means and said effective drive transistor width determining the switching delay time for a pull-up transition.

7. An output buffer for receiving a data signal and generating a responsive output signal, a response to a transition in the data signal occurring after a controllable switching delay time so that the output signal response is available within a prescribed delay time, the prescribed delay time being referenced to a clock cycle, the output buffer comprising:

a first transistor means for driving said output signal for a pull-up transition;

a pull-up predriving means for predriving said first transistor means;

a second transistor means for driving said output signal for a pull-down transition;

a pull-down predriving means for predriving said second transistor means;

said pull-up predriving means receiving a plurality of first digital control signals for determining the turn-on slew rate for said first transistor means;

said pull-down predriving means receiving a plurality of second digital control signals for determining the turn-on slew rate for said second transistor means;

said plurality of first control signals and said plurality of second control signals being defined with reference to a clock cycle; and a plurality of second transistor means, in which said pull-up predriving means has an active configuration defined by said plurality of second control signals, said active configuration determining which one or more of said plurality of second transistor means are predriven, said one or more predriven second transistor means determining an effective drive transistor width, the turn-on slew rate for said one or more predriven first transistor means and said effective drive transistor width determining the switching delay time for a pull-up transition.

8. An output buffer for receiving a data signal and generating a responsive output signal, a response to a transition in the data signal occurring after a controllable switching delay time so that the output signal response is available within a prescribed delay time, the prescribed delay time being referenced to a clock cycle, the output buffer comprising:

a first transistor means for driving said output signal for a pull-up transition;

a pull-up predriving means for predriving said first transistor means;

a second transistor means for driving said output signal for a pull-down transition;

a pull-down predriving means for predriving said second transistor means;

said pull-up predriving means receiving a plurality of first digital control signals for determining the turn-on slew rate for said first transistor means;

said pull-down predriving means receiving a plurality of second digital control signals for determining the turn-on slew rate for said second transistor means;

said plurality of first control signals and said plurality of second control signals being defined with reference to a clock cycle; and means for defining said first plurality and said second plurality of control signals, said defining means having:

an up/down counting means for generating said first plurality and said second plurality of control signals, said counting means counting after a fixed interval of clock cycles to derive one plurality of control signals from said first plurality and second plurality of control signals, the counting means having a directional input signal for defining the count direction, said output signal coupled to said directional input signal, said output signal at a clock cycle reference time defining said directional input signal at the time of counting.

9. The output buffer combination of claim 8 in which said defining means further comprises means receiving said output signal for sampling said output signal at said prescribed delay time to generate said directional input signal, said prescribed delay time corresponding to the clock cycle reference time.

10. The output buffer combination of claim 8 in which said output buffer and said defining means form a feedback loop for controlling said first plurality of control signals of the output buffer, a binary encoding of said first plurality of control signals under steady state conditions toggling at a regular interval between two consecutive binary values.

11. An output buffer for receiving a data signal and generating a responsive output signal, a response to a transition in the data signal occurring after a controllable switching delay time so that the output signal response is available within a prescribed delay time, the prescribed delay time being referenced to a clock cycle, the output buffer comprising:

a first transistor means for driving said output signal for a pull-up transition;

a pull-up predriving means for predriving said first transistor means;

a second transistor means for driving said output signal for a pull-down transition;

a pull-down predriving means for predriving said second transistor means;

said pull-up predriving means receiving a plurality of first digital control signals for determining the turn-on slew rate for said first transistor means;

said pull-down predriving means receiving a plurality of second digital control signals for determining the turn-on slew rate for said second transistor means;

said plurality of first control signals and said plurality of second control signals being defined with reference to a clock cycle; and wherein said switching delay time is referenced to 0.75 T, where T equals one clock cycle period.

12. An output buffer for receiving a data signal and generating a responsive output signal, a response to a transition in the data signal occurring after a controllable switching delay time so that the output signal response is available within a prescribed delay time, the prescribed delay time being referenced to a clock cycle, the output buffer comprising:

a first transistor means for driving said output signal for a pull-up transition;

a pull-up predriving means for predriving said first transistor means;

a second transistor means for driving said output signal for a pull-down transition;

a pull-down predriving means for predriving said second transistor means;

said pull-up predriving means receiving a plurality of first digital control signals for determining the turn-on slew rate for said first transistor means;

said pull-down predriving means receiving a plurality of second digital control signals for determining the turn-on slew rate for said second transistor means;

said plurality of first control signals and said plurality of second control signals being defined with reference to a clock cycle; and wherein said switching delay time is referenced to 1.00 T, where T equals one clock cycle period.

13. A combination comprising a plurality of output buffers and a means for defining a plurality of control signals, one of said plurality of output buffers and said defining means forming a feedback loop for controlling said plurality of control signals, each of said plurality of output buffers receiving said plurality of control signals, said plurality of signals determining the switching time delay for each of said plurality of output buffers relative to a clock cycle period; and an output buffer receiving a data signal and generating a responsive output signal having:

a plurality of first transitive means for driving an output signal; and means receiving said data signal for selectively predriving one or more of said plurality of transitive means in response to a transition in the data signal, said predriving means receiving said plurality of control signals for defining which one or more of said plurality of transitive means are predriven and for defining a configuration of the predriving means, the selected one or more of said transitive means predriven and for defining a configuration of the predriving means, the selected one or more of said transitive means predriven and the configuration of the predriving means defining the switching delay time of the output buffer.

14. The combination of claim 13 in which said defining means comprises:

an up/down counting means for generating said plurality of control signals, said counting means counting after a regular interval of clock cycles to derive said plurality of control signals; the counting means having a directional input signal for defining the count direction, the output signal from said one of said plurality of output buffers coupled to said directional input signal, the state of said output signal from said one of said plurality of output buffers at a clock cycle reference time defining the state of said directional input signal at the time of counting; and means receiving said output signal from said one of said plurality of output buffers for sampling said output signal at said prescribed delay time to generate said directional input signal, said prescribed delay time corresponding to said clock cycle reference time.

15. A method of referencing the switching delay of an output buffer to a clock cycle reference time, the output buffer receiving a plurality of control signals, the plurality of control signals forming a binary encoding, varying binary encoding determining varying absolute switching delay times of the output buffer, the method comprising the steps:

receiving a data signal as an input to the output buffer;

generating an output data signal at said output buffer in response to said data signal;

sampling a first signal derived from said output data signal at the clock cycle reference time; and incrementing or decrementing a binary encoding, the direction of change determined by the state of said first signal at the clock cycle reference time.

16. The method of claim 15 further comprising the steps: repeating the receiving, generating, sampling and incrementing/decrementing steps for adjusting the binary encoding.

17. The method of claim 16 in which the binary encoding is adjusted periodically to achieve a steady state condition at which the binary encoding toggles during consecutive adjustments between two values so as to reference the output buffer switching delay time to the approximate clock cycle reference time.

18. The method of claim 15 in which the incrementing/decrementing step comprises the steps:

generating from a clock signal a toggle signal input to an up/down counter;

defining a counter direction based on the state of the first signal at the clock cycle reference time; and incrementing or decrementing the counter as defined by the counter direction to define the state of the set of digital control signals.

19. The method of claim 15 in which distinct binary encoding determine distinct di/dt values for the output buffer.

* * * * *

UNITED STATES PATENT AND TRADEMARK OFFICE
CERTIFICATE OF CORRECTION

PATENT NO. : 5,285,116
DATED : Feb. 8, 1994
INVENTOR(S) : Albert Thaik

It is certified that error appears in the above-indentified patent and that said Letters Patent is hereby corrected as shown below:

Col. 10, line 29, insert a --,-- after e.g.

Column 20, line 56 - Duplicated text - please delete "for defining a configuration of the predriving means, the selected one or more of said transitive means predriven and"

Signed and Sealed this

Twenty-sixth Day of July, 1994

Attest:

BRUCE LEHMAN

*Attesting Officer*    *Commissioner of Patents and Trademarks*